United States Patent
Baba et al.

(10) Patent No.: US 11,942,539 B2
(45) Date of Patent: Mar. 26, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shotaro Baba, Kanazawa Ishikawa (JP); Hiroaki Katou, Nonoichi Ishikawa (JP); Yuhki Fujino, Kanazawa Ishikawa (JP); Kouta Tomita, Nonoichi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 151 days.

(21) Appl. No.: 17/471,739

(22) Filed: Sep. 10, 2021

(65) Prior Publication Data
US 2022/0310837 A1   Sep. 29, 2022

(30) Foreign Application Priority Data
Mar. 24, 2021   (JP) ................ 2021-049759

(51) Int. Cl.
*H01L 29/78*   (2006.01)
*H01L 21/763*   (2006.01)
(Continued)

(52) U.S. Cl.
CPC ........ *H01L 29/7813* (2013.01); *H01L 21/763* (2013.01); *H01L 29/0638* (2013.01);
(Continued)

(58) Field of Classification Search
CPC .............. H01L 29/7813; H01L 21/763; H01L 29/0638; H01L 29/407; H01L 29/7838; H01L 29/861; H01L 21/221; H01L 29/04; H01L 29/0696; H01L 21/3221; H01L 29/167; H01L 29/7811; H01L 29/0603; H01L 29/7803; H01L 29/66674–66734; H01L 29/7801–7826;
(Continued)

(56) References Cited

U.S. PATENT DOCUMENTS 8,716,747 B2   5/2014   Saito et al.
8,748,236 B2   6/2014   Tanida
(Continued)

FOREIGN PATENT DOCUMENTS

JP   2009-130002 A   6/2009
JP   2011-216825 A   10/2011
(Continued)

*Primary Examiner* — Shahed Ahmed
(74) *Attorney, Agent, or Firm* — Kim & Stewart LLP

(57) ABSTRACT

A semiconductor device includes a polycrystalline silicon part buried in a termination region of a silicon layer. The polycrystalline silicon part contacts the silicon layer, has a higher crystal grain density than the silicon layer, and includes a heavy metal. The silicon layer includes a drift layer located in a cell region and the termination region. The drift layer has a lower first-conductivity-type impurity concentration than a silicon substrate. The drift layer includes a same element of heavy metal as the heavy metal included in the polycrystalline silicon part.

15 Claims, 8 Drawing Sheets

(51) Int. Cl.
*H01L 29/06* (2006.01)
*H01L 29/40* (2006.01)
*H01L 29/861* (2006.01)

(52) U.S. Cl.
CPC ........ *H01L 29/407* (2013.01); *H01L 29/7838* (2013.01); *H01L 29/861* (2013.01)

(58) Field of Classification Search
CPC ... H01L 29/7833–7836; H01L 29/0856–0869; H01L 29/0873–0886; H01L 21/2022–2026; H01L 21/02595
See application file for complete search history.

(56) References Cited

U.S. PATENT DOCUMENTS

| | | | |
|---|---|---|---|
| 2008/0135930 A1* | 6/2008 | Saito | H01L 29/7812 257/330 |
| 2012/0056262 A1* | 3/2012 | Saito | H01L 29/7811 257/330 |
| 2012/0241854 A1 | 9/2012 | Ohta et al. | |
| 2014/0167145 A1* | 6/2014 | Ichinoseki | H01L 29/4238 257/329 |
| 2016/0104622 A1 | 4/2016 | Oefner et al. | |
| 2016/0293691 A1* | 10/2016 | Falck | H01L 29/7811 |
| 2018/0076307 A1 | 3/2018 | Shimomura et al. | |
| 2019/0287962 A1 | 9/2019 | Naito | |
| 2020/0303507 A1* | 9/2020 | Yilmaz | H01L 29/4236 |
| 2021/0043458 A1 | 2/2021 | Fujino | |
| 2021/0125889 A1* | 4/2021 | Chen | H01L 29/66348 |

FOREIGN PATENT DOCUMENTS

| | | |
|---|---|---|
| JP | 2012-204395 A | 10/2012 |
| JP | 2015-065464 A | 4/2015 |
| JP | 2016-213390 A | 12/2016 |
| JP | 6121501 B2 | 4/2017 |
| JP | 2018-046201 A | 3/2018 |
| JP | 2019-161125 A | 9/2019 |
| JP | 2021-027229 A | 2/2021 |
| WO | 2012/063342 A1 | 5/2012 |

* cited by examiner

SEMICONDUCTOR DEVICE

CROSS-REFERENCE TO RELATED APPLICATION

This application is based upon and claims the benefit of priority from Japanese Patent Application No. 2021-049759, filed on Mar. 24, 2021; the entire contents of which are incorporated herein by reference.

FIELD

Embodiments described herein relate generally to a semiconductor device.

BACKGROUND

In a MOSFET (Metal-Oxide-Semiconductor Field Effect Transistor), a built-in diode (a body diode) exists separately from an operation part that is controlled by a gate electrode. Improving the reverse recovery characteristics of the built-in diode can contribute to the efficiency of the circuit. In a known method of improving the reverse recovery characteristics of the built-in diode, the lifetime of carriers in a drift layer is controlled by introducing a heavy metal or the like to the drift layer.

DETAILED DESCRIPTION

Figure 1:
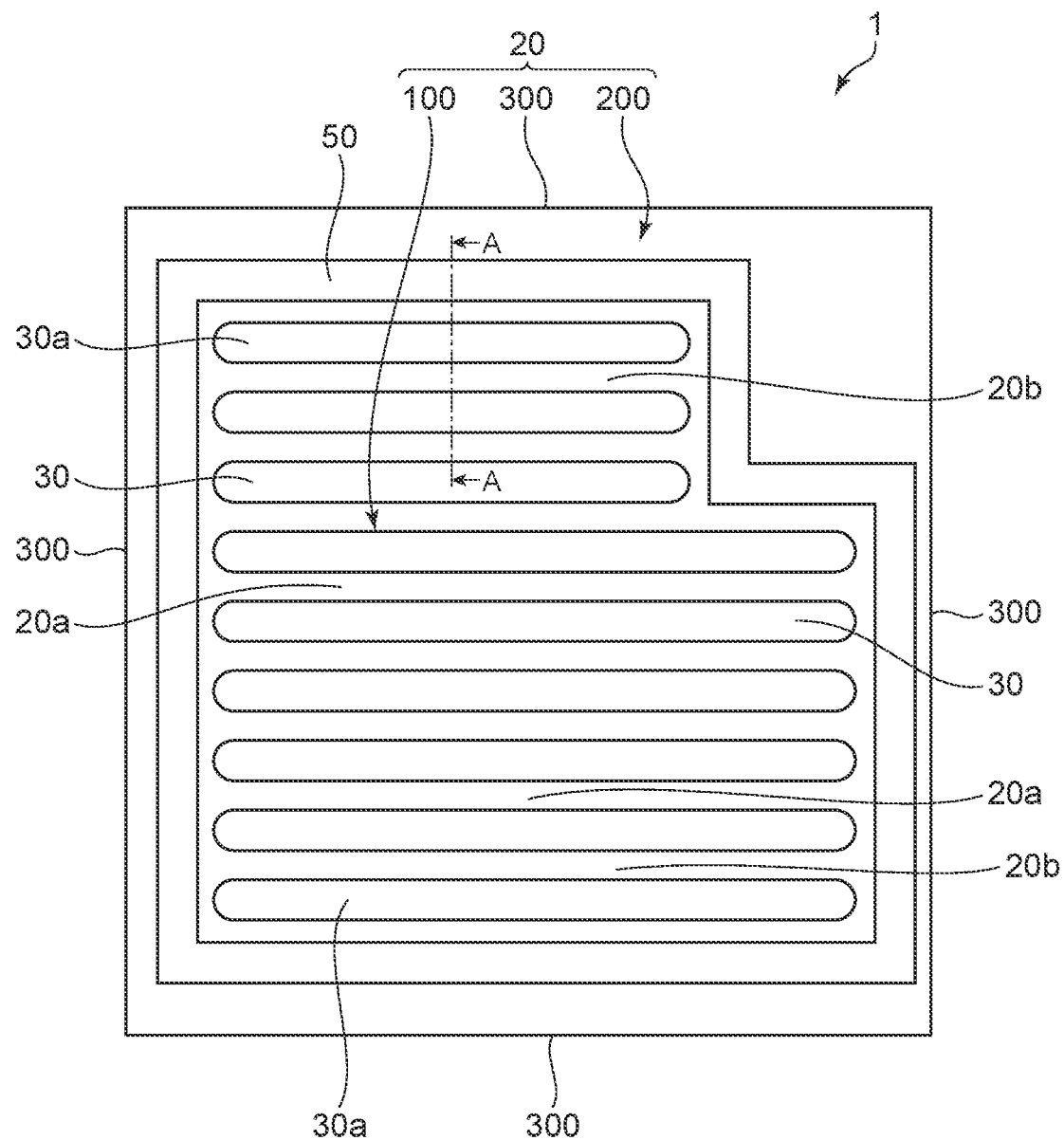
FIG. 1 is a schematic plan view of a semiconductor device of a first embodiment.

According to one embodiment, a semiconductor device includes an upper electrode; a lower electrode; a silicon substrate positioned between the upper electrode and the lower electrode, the silicon substrate being of a first conductivity type and contacting the lower electrode; a silicon layer positioned between the silicon substrate and the upper electrode, the silicon layer including a cell region, a side surface, and a termination region positioned between the cell region and the side surface; a gate electrode located in the cell region of the silicon layer; a gate insulating film located between the gate electrode and the silicon layer; and a polycrystalline silicon part buried in the termination region of the silicon layer. The polycrystalline silicon part contacts the silicon layer, has a higher crystal grain density than the silicon layer, and includes a heavy metal. The silicon layer includes a drift layer located in the cell region and the termination region. The drift layer is of the first conductivity type and has a lower first-conductivity-type impurity concentration than the silicon substrate. The drift layer includes a same element of heavy metal as the heavy metal included in the polycrystalline silicon part. The silicon layer includes a base layer located on the drift layer of the cell region. The base layer is of a second conductivity type and contacts the upper electrode. And the silicon layer includes a source layer located on the base layer. The source layer is of the first conductivity type, contacts the upper electrode, and has a higher first-conductivity-type impurity concentration than the drift layer. The termination region does not include the base layer contacting the upper electrode, the source layer contacting the upper electrode, and the gate electrode.

Embodiments will now be described with reference to the drawings. The same components in the drawings are marked with the same reference numerals. Although the first conductivity type is described as an n-type and the second conductivity type is described as a p-type in embodiments described below, the first conductivity type may be the p-type, and the second conductivity type may be the n-type.

First Embodiment

FIG. 1 is a schematic plan view of a semiconductor device 1 of a first embodiment. Only characteristic portions are shown in FIG. 1 for easier understanding of the description.

Figure 2:
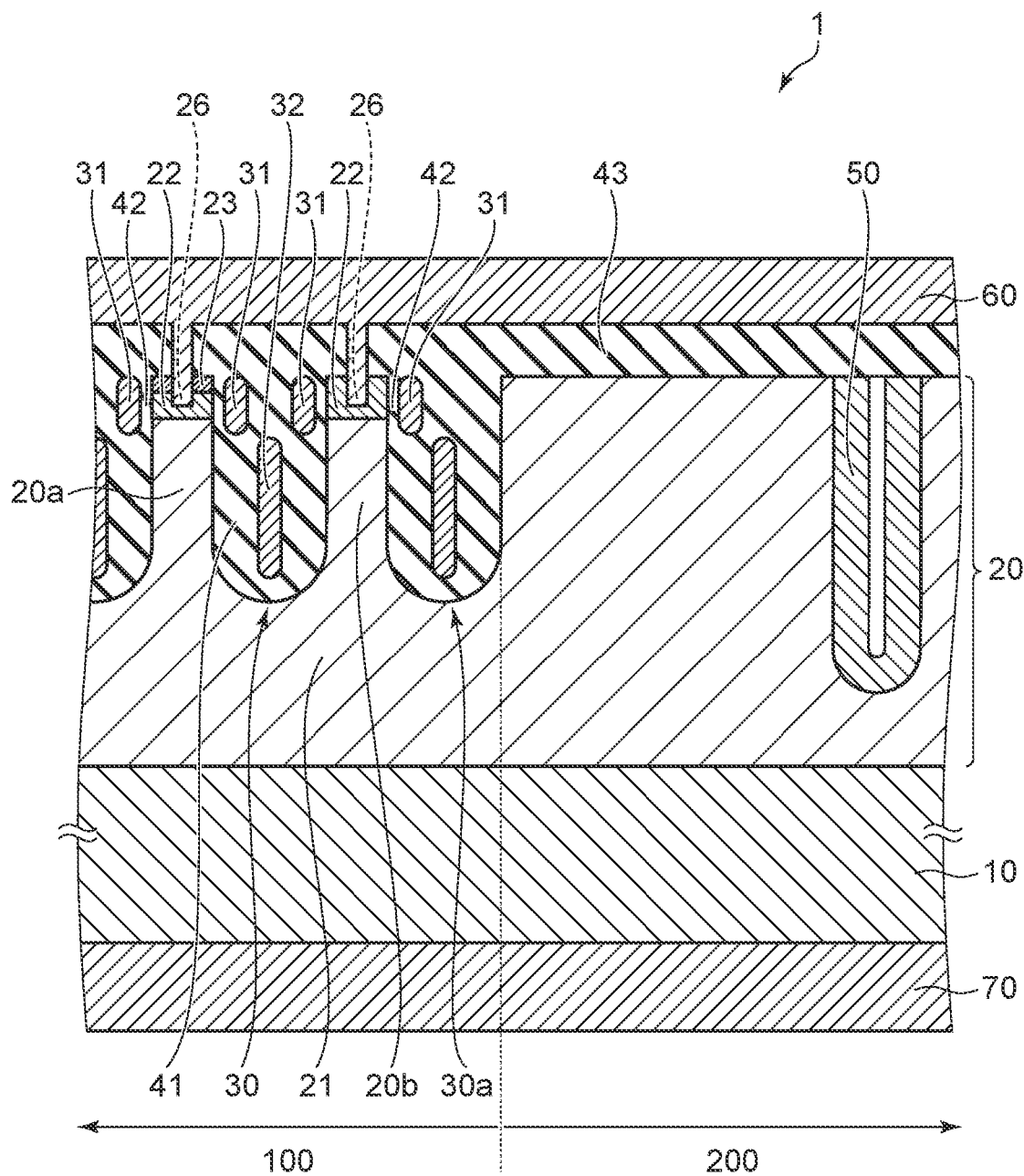
FIG. 2 is a schematic cross-sectional view along line A-A of FIG. 1.

FIG. 2 is a schematic cross-sectional view along line A-A of FIG. 1.

As shown in FIG. 2, the semiconductor device 1 includes an upper electrode 60, a lower electrode 70, a silicon substrate 10 that is positioned between the upper electrode 60 and the lower electrode 70, a silicon layer 20 that is positioned between the silicon substrate 10 and the upper electrode 60, and multiple buried structure parts 30 buried in the silicon layer 20. The "upper" of the upper electrode 60 and the "lower" of the lower electrode 70 are relative positional relationships used for the description and are independent of the direction of gravity. The buried structure part 30 includes at least a gate electrode 31 and a gate insulating film 42. According to the embodiment, the buried structure part 30 further includes a field plate electrode 32, and an insulating film 41 that covers the upper end, lower end, and side surface of the field plate electrode 32. The semiconductor device 1 is a vertical semiconductor device in which a current is caused to flow in a direction (the vertical direction) connecting the upper electrode 60 and the lower electrode 70 by a control of the gate electrode 31.

The silicon layer 20 is located on the silicon substrate 10. The lower electrode 70 is located at the back surface of the silicon substrate 10. Multiple trenches are formed in the silicon layer 20; and the buried structure parts 30 are located in the trenches. The silicon layer 20 includes multiple mesa parts 20a next to the buried structure parts 30. The mesa parts 20a that are next to the trenches also are formed simultaneously when forming the trenches for forming the components of the buried structure parts 30 described above in the silicon layer 20. The buried structure parts 30 do not reach the silicon substrate 10.

As shown in FIG. 1, for example, the multiple buried structure parts 30 and the multiple mesa parts 20a extend in stripe shapes. Among the stripe-shaped multiple buried structure parts 30, the buried structure part that is positioned endmost in the direction in which the multiple buried structure parts 30 are arranged is taken as an outermost buried structure part 30a. Among the stripe-shaped multiple mesa parts 20a, the mesa part that is next to the outermost buried structure part 30a is taken as an outermost mesa part 20b.

As shown in FIG. 1, the planar shape of the silicon layer 20 is a rectangular shape that includes four side surfaces 300. The silicon layer 20 includes a cell region 100 and a termination region 200. The termination region 200 is positioned between the cell region 100 and the side surfaces 300. The buried structure parts 30 and the mesa parts 20a are located in the cell region 100.

The shape of the rectangle that includes the four side surfaces 300 is arbitrary. For example, a rectangle such as that shown in FIG. 6 may be used. When the buried structure parts 30 extend in stripe shapes, the number of directions in which the stripes extend is arbitrary. For example, the stripes may extend in two directions such as those shown in FIG. 6. Also, the shape of the buried structure part 30 when viewed along a direction perpendicular to the planar shape formed by the four side surfaces 300 may not be a stripe shape. For example, an aggregate of multiple regular hexagonal shapes arranged to have the densest arrangement inward of the termination region 200 may be used, or an aggregate of circles may be used.

As shown in FIG. 2, the silicon layer 20 includes a drift layer 21 that is located on the silicon substrate 10, a base layer 22, and a source layer 23. The conductivity types of the silicon substrate 10 and the drift layer 21 are the n-type. The n-type impurity concentration of the drift layer 21 is lower than the n-type impurity concentration of the silicon substrate 10. The silicon substrate 10 and the drift layer 21 are located in the cell region 100 and the termination region 200. The termination region 200 does not include the base layer 22 that contacts the upper electrode 60, the source layer 23 that contacts the upper electrode 60, and the gate electrode 31.

The mesa part 20a includes a portion of the drift layer 21, the p-type base layer 22 that is located on the portion of the drift layer 21, and the n-type source layer 23 that is located at the front surface of the base layer 22. The n-type impurity concentration of the source layer 23 is higher than the n-type impurity concentration of the drift layer 21.

The outermost mesa part 20b that is next to the outermost buried structure part 30a includes a portion of the drift layer 21, and the p-type base layer 22 that is located on the portion of the drift layer 21. The source layer 23 is not included in the outermost mesa part 20b. Therefore, the current control (the MOS operation) due to the gate electrode 31 does not occur in the outermost mesa part 20b. In the termination region 200, the spreading of the depletion layer due to the fluctuation of the potential is different from that of the cell region 100. By setting the mesa part that is proximate to the termination region 200 to be the outermost mesa part 20b that does not have a MOS operation, and by forming the outermost buried structure part 30a, the spreading of the depletion layer between the cell region 100 and the termination region 200 can be uniform, and the reduction of the breakdown voltage can be suppressed.

For example, in the structure of the outermost buried structure part 30a, only one gate electrode 31 may be formed at one side (the outermost mesa part 20b side), or no gate electrodes 31 may be formed. When the reduction of the breakdown voltage is not a problem, the outermost mesa part 20b and the outermost buried structure part 30a may not be formed. Conversely, when the reduction of the breakdown voltage is a problem, the number of sets that include the outermost mesa part 20b and the outermost buried structure part 30a in each set may be two or more.

Figure 8:
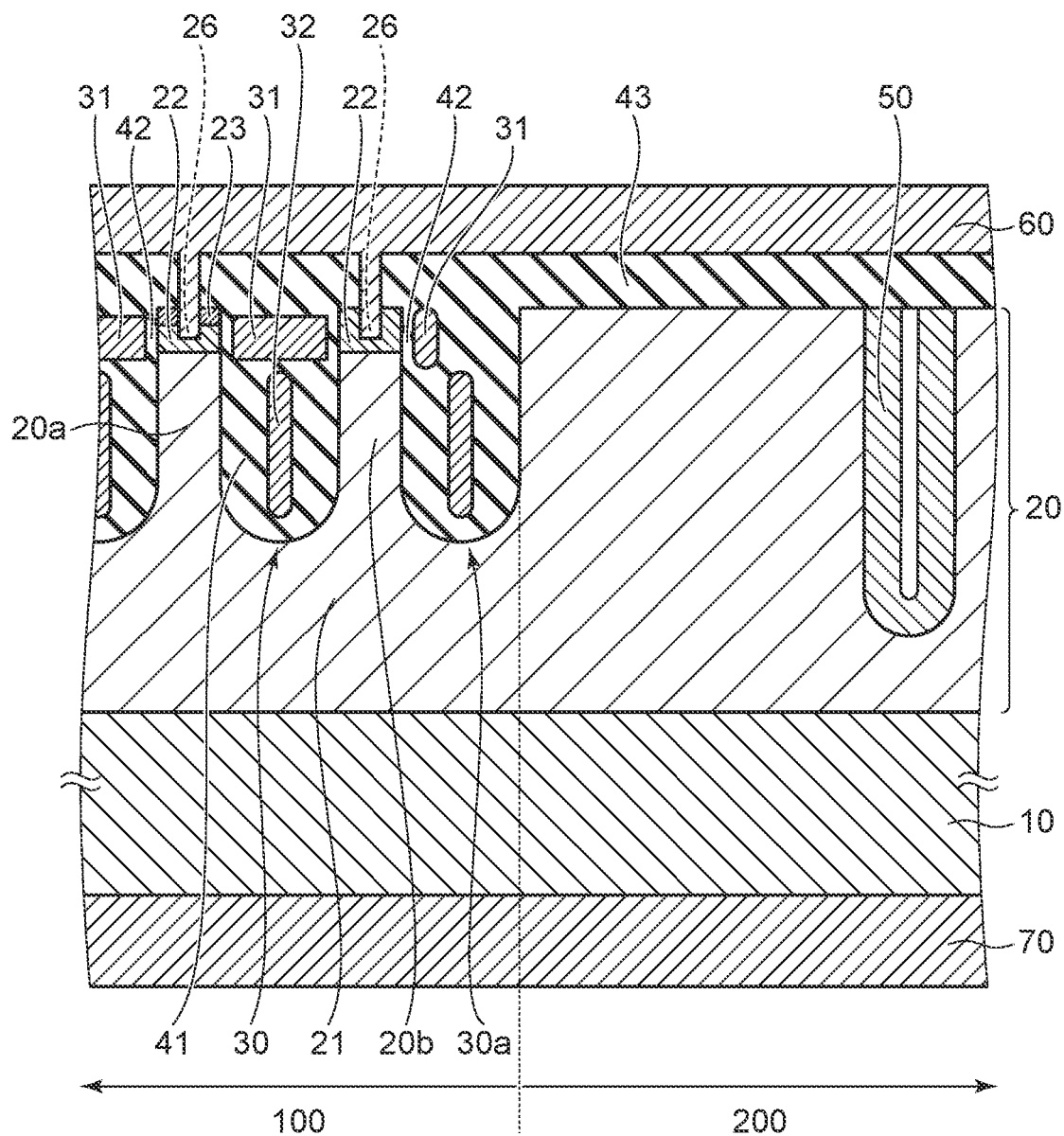
FIG. 8 is a schematic cross-sectional view of a semiconductor device according to a third modification of embodiments.

For example, two gate electrodes 31 are located in one buried structure part 30. For example, the gate electrodes 31 may have one linked structure in one buried structure part 30 such as that shown in FIG. 8. The gate electrode 31 faces the side surface of the base layer 22 via the gate insulating film 42. The gate insulating film 42 is located between the gate electrode 31 and the side surface of the base layer 22. Also, seams and/or voids may be formed in the gate electrode 31.

An n-type channel (an inversion layer) can be formed in the portion of the base layer 22 that faces the gate electrode 31 by applying a voltage that is not less than a threshold to the gate electrode 31.

The buried structure part 30 also includes the field plate electrode 32. The field plate electrode 32 is positioned at substantially the center in the width direction (the lateral direction) of the buried structure part 30. The field plate electrode 32 extends through the buried structure part 30 lower than the gate electrode 31. The bottom portion of the field plate electrode 32 is more proximate than the bottom portion of the gate electrode 31 to the silicon substrate 10. The field plate electrode 32 is not limited to being completely filled, and seams and/or voids may be formed in the field plate electrode 32.

The insulating film 41 is located between the field plate electrode 32 and the drift layer 21 and between the field plate electrode 32 and the gate electrode 31. The insulating film 41 may be formed of the same material or may be formed of multiple different materials.

For example, the field plate electrode 32 is electrically connected with the upper electrode 60. Or, the field plate electrode 32 may be electrically connected with the gate electrode 31. The field plate electrode 32 relaxes the distribution of the electric field of the drift layer 21 in the off-state in which the application to the gate electrode 31 of the voltage that is not less than the threshold is stopped.

The upper electrode 60 is located on the silicon layer 20 and on the buried structure part 30. An insulating film 43 is located between the gate electrode 31 and the upper electrode 60 and between the field plate electrode 32 and the upper electrode 60.

A contact portion 26 is formed in the source layer 23 and the base layer 22 that are included in the upper portion of the mesa part 20a; and a portion of the upper electrode 60 is located inside the contact portion 26. The source layer 23 and the base layer 22 are electrically connected with the upper electrode 60 by a so-called trench contact structure. The source layer 23 that is electrically connected with the upper electrode 60 and the base layer 22 that is electrically connected with the upper electrode 60 are provided in the cell region 100 but are not provided in the termination region 200.

A polycrystalline silicon part 50 is buried in the drift layer 21 of the termination region 200. The polycrystalline silicon part 50 is buried by, for example, CVD (Chemical Vapor Deposition) in a trench after forming the trench in the drift layer 21 of the termination region 200. The polycrystalline silicon part 50 is not limited to completely filling the interior of the trench; and seams and/or voids may be formed in the polycrystalline silicon part 50.

Figure 7:
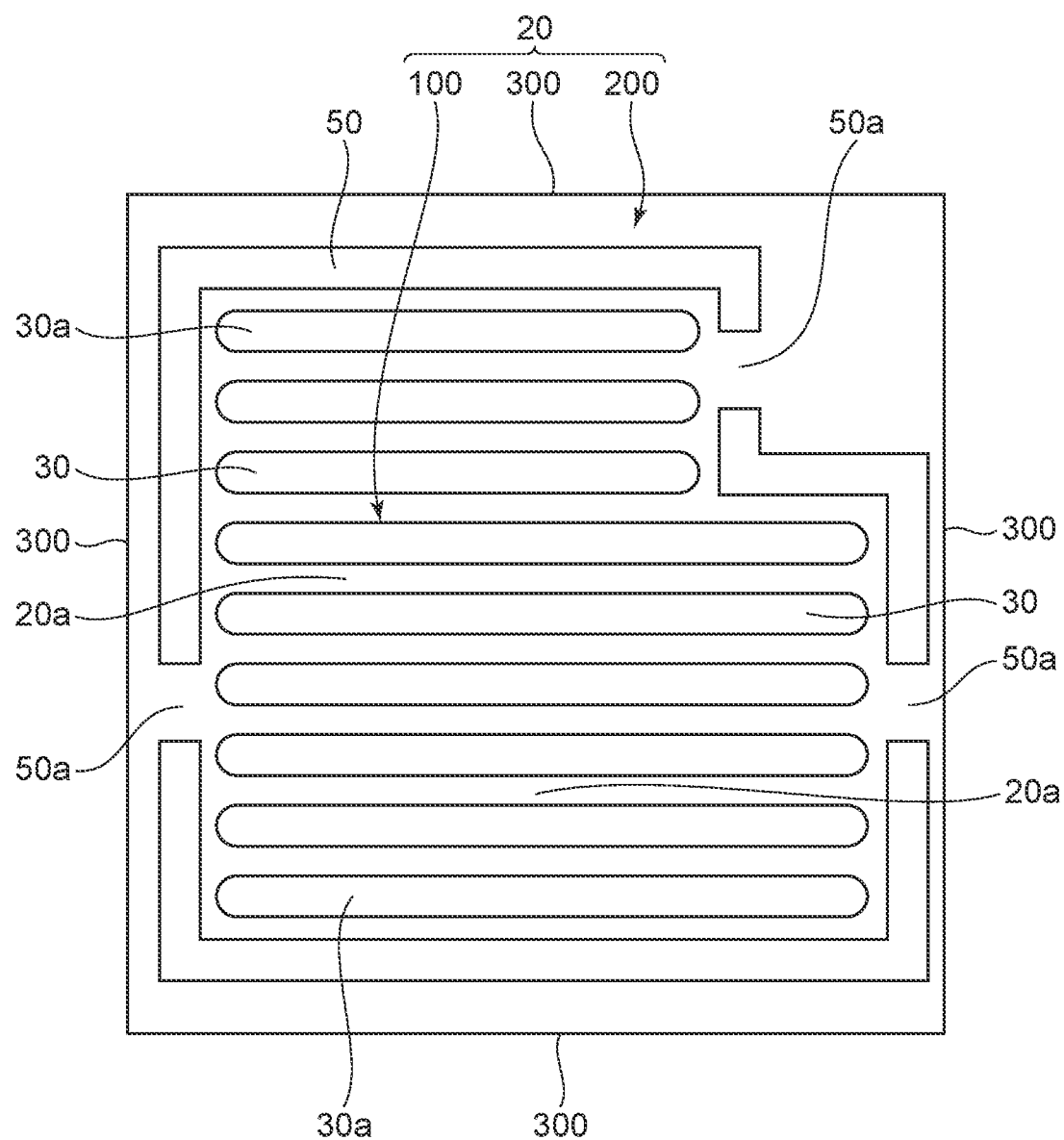
FIG. 7 is a schematic plan view of a semiconductor device according to a second modification of embodiments.

For example, a structure may be used in which a gap 50a such as that shown in FIG. 7 is provided in the polycrystalline silicon part 50. A trench is not formed in the drift layer 21 in the region of the gap 50a. Although the number of the gaps 50a provided in the polycrystalline silicon part 50 is arbitrary, a structure that surrounds the buried structure parts 30 as one link as shown in FIG. 1 is desirable. The diffusion of the heavy metal (Pt, Au, etc.) into the termination region 200 described below can be further prevented thereby.

Figure 6:
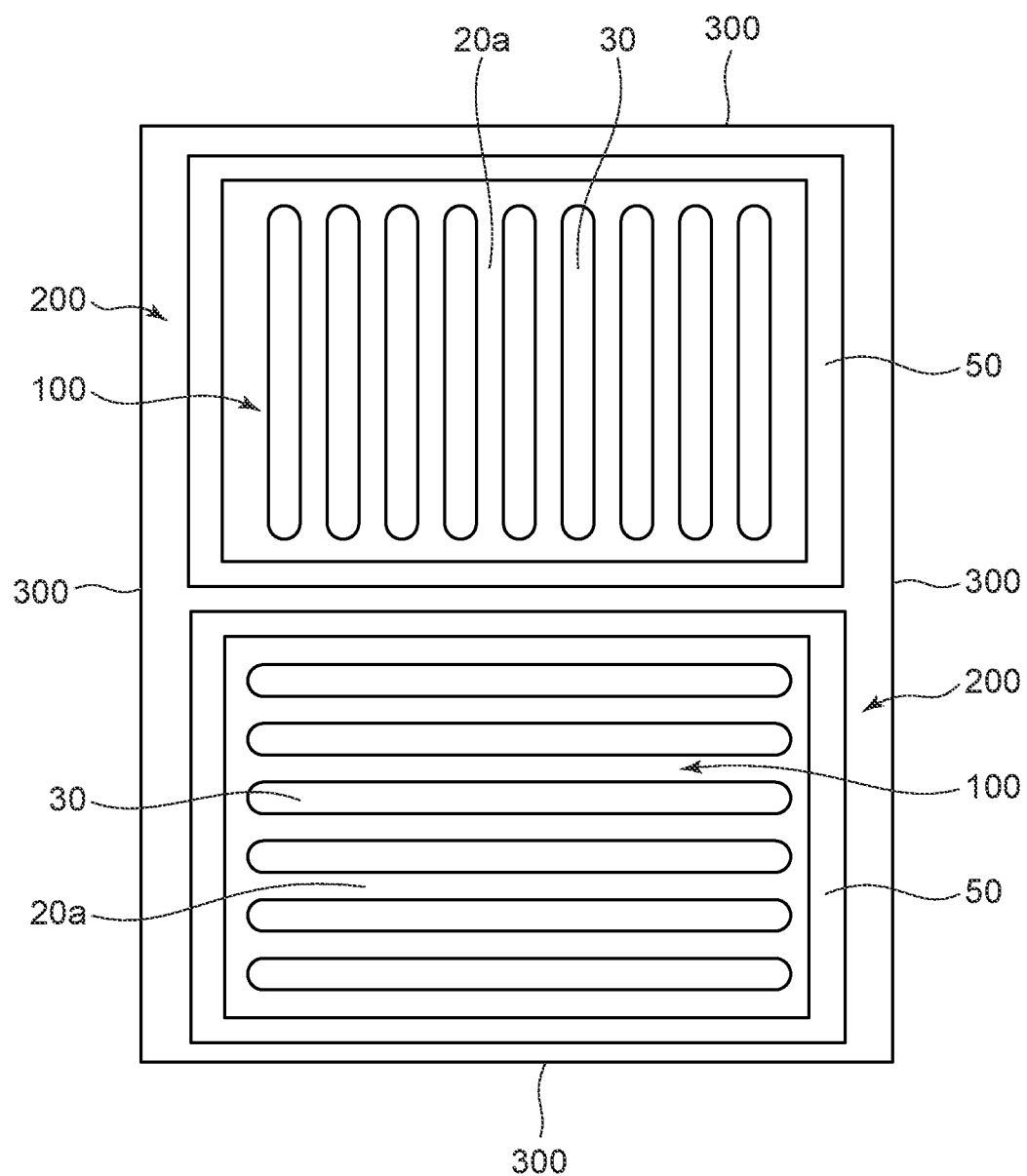
FIG. 6 is a schematic plan view of a semiconductor device according to a first modification of embodiments.

In the case of a structure in which the stripe-shaped buried structure parts 30 shown in FIG. 6 extend in multiple directions, the multiple buried structure parts 30 that extend in the same direction are taken as one set. The number of sets of the buried structure parts 30 surrounded with the polycrystalline silicon part 50 is arbitrary. For example, a structure may be used in which each set of buried structure parts 30 such as those shown in FIG. 6 is surrounded with the polycrystalline silicon part 50. For example, a structure may be used in which the buried structure parts 30 are surrounded with two or more sets of polycrystalline silicon parts 50. The gap 50a may be provided in such a case.

The polycrystalline silicon part 50 is directly buried in the trench that is formed in the drift layer 21 without interposing an insulating film such as a silicon oxide film or the like. The side surface and bottom surface of the polycrystalline silicon part 50 contact the drift layer 21. An insulating film such as a silicon oxide film or the like is not provided between the polycrystalline silicon part 50 and the drift layer 21. The upper surface of the polycrystalline silicon part 50 contacts the insulating film 43. The polycrystalline silicon part 50 is electrically insulated from the upper electrode 60.

The silicon layer 20 that includes the drift layer 21 is a single-crystal layer (or a layer that has high crystallinity approaching that of a single crystal) that is epitaxially grown on the silicon substrate 10; the polycrystalline silicon part 50, however, is made of polycrystalline silicon that has a higher crystal grain density than the silicon layer 20. The crystal grain boundary density of the polycrystalline silicon part 50 is higher than the crystal grain boundary density of the silicon layer 20.

The polycrystalline silicon part 50 includes a heavy metal. The heavy metal is, for example, Pt or Au. In the cell region 100 and the termination region 200 of the drift layer 21, the region that is between the cell region 100 and the polycrystalline silicon part 50 includes the same element of heavy metal as the heavy metal included in the polycrystalline silicon part 50.

A method for manufacturing the semiconductor device 1 will now be described.

The silicon layer 20 is formed on the silicon substrate 10; and the buried structure part 30 and the polycrystalline silicon part 50 are formed in the silicon layer 20. For example, the polycrystalline silicon part 50 is formed before the buried structure part 30. The base layer 22 and the source layer 23 are formed in the upper portion of the mesa part 20a by, for example, ion implantation. Subsequently, the insulating film 43 is formed on the silicon layer 20 and on the buried structure part 30. After forming the insulating film 43, the contact portion 26 that extends through the insulating film 43 and reaches the base layer 22 and the source layer 23 is formed. A heavy metal (Pt, Au, or the like) is diffused in the drift layer 21. As a technique for diffusing the heavy metal, a technique of forming a silicide layer in the contact portion 26 and performing diffusion by heat treatment can be used, or a technique using ion implantation to implant the heavy metal into the contact portion 26 vicinity and performing diffusion by heat treatment can be used. In the technique of forming the silicide layer in the contact portion 26 and performing diffusion by heat treatment, for example, a Pt film is formed as a film that includes the heavy metal in the contact portion 26. After forming the Pt film, heat treatment is performed to form a Pt silicide in the portion where the Pt film and the upper portion of the mesa part 20a (the base layer 22 and the source layer 23) contact. After forming the Pt silicide, heat treatment is performed at a higher temperature than the heat treatment that forms the Pt silicide; and Pt is diffused in the drift layer 21. Subsequently, the Pt silicide and the Pt film are removed; and the upper electrode 60 is formed in the contact portion 26 and on the insulating film 43.

The heavy metal (Pt, Au, or the like) that is diffused in the drift layer 21 functions as a lifetime killer that forms a recombination center of electrons and holes. In a reverse recovery operation in which a reverse bias is applied to the built-in diode of the semiconductor device 1 (the P-I-N diode that includes the base layer 22, the drift layer 21, and the silicon substrate 10), one of the carriers (an electron or a hole) that remains in the drift layer 21 is trapped by the heavy metal (Pt, Au, etc.) and recombines with the other carrier. A reverse recovery charge Qrr of the built-in diode can be reduced thereby, and the reverse recovery characteristics can be improved.

The carriers that are in the drift layer 21 are more plentiful in the cell region 100 than in the termination region 200; therefore, it is desirable for the heavy metal described above to exist as a lifetime killer in the cell region 100 for lifetime control.

In a state in which the built-in diode is biased in the forward direction, the holes that are injected from the p-type base layer 22 of the cell region 100 into the drift layer 21 also flow in the termination region 200. In the reverse recovery operation of the built-in diode, the holes of the cell region 100 are ejected into the upper electrode 60 via the base layer 22; and holes also return to the cell region 100 side from the termination region 200.

The drift layer 21 that is at the upper surface of the termination region 200 does not contact the upper electrode 60; therefore, in the reverse recovery operation, the holes of the termination region 200 are ejected into the upper electrode 60 by moving into the cell region 100 by flowing around under the outermost buried structure part 30a at the outer perimeter of the cell region 100. In other words, the holes of the termination region 200 are ejected less easily than the holes of the cell region 100. It is favorable for some amount of the heavy metal also to exist in the termination region 200 to reduce the return current (a so-called tail current) from the termination region 200.

According to the embodiment, the heavy metal can be retained in the drift layer 21 of the cell region 100; and some amount of the heavy metal also can be retained in the termination region 200 due to the polycrystalline silicon part 50 that is formed in the termination region 200.

The grain boundaries of the polycrystalline silicon part 50 function as gettering sites of the heavy metal such as Pt, Au, etc. Among the heavy metal that is introduced to the drift layer 21 of the cell region 100 by the metal silicide film formed in the contact portion 26 described above acting as a diffusion source, the heavy metal that diffuses into the termination region 200 is trapped in the polycrystalline silicon part 50. The polycrystalline silicon part 50 that traps the heavy metal also functions as a new heavy metal diffusion source. Accordingly, the heavy metal can be retained in the drift layer 21 in the region between the polycrystalline silicon part 50 and the original heavy metal diffusion source (the formation portion of the contact portion 26).

The polycrystalline silicon part 50 may be of the n-type, may be of the p-type, or may be undoped. The polycrystalline silicon part 50 may have material properties similar to the gate electrode 31 or the field plate electrode 32.

The heavy metal concentration in the drift layer 21 of the cell region 100 and the heavy metal concentration in the drift layer 21 in the region between the cell region 100 and the polycrystalline silicon part 50 are higher than the heavy metal concentration in the drift layer 21 in the region between the polycrystalline silicon part 50 and the side surface 300.

The thermal diffusion length of the heavy metal (Pt, Au, etc.) in single-crystal silicon is relatively long; therefore, when the polycrystalline silicon part 50 is not provided in the termination region 200, it is difficult to retain the heavy metal in the region of the termination region 200 next to the cell region 100.

By providing the polycrystalline silicon part 50 in the termination region 200 according to the embodiment, the heavy metal concentration in the region of the termination region 200 between the cell region 100 and the polycrystalline silicon part 50 also can be increased; therefore, the return current from the termination region 200 in the reverse recovery operation of the built-in diode can be suppressed, and the reverse recovery characteristics can be improved.

To suppress the diffusion of the heavy metal into the region outward of the polycrystalline silicon part 50, it is desirable for the polycrystalline silicon part 50 to continuously surround the cell region 100 as shown in FIG. 1.

Also, the reverse recovery current in the termination region 200 is suppressed because polycrystalline silicon includes more defects than single-crystal silicon; and the polycrystalline silicon part 50 itself includes an energy level that becomes a recombination center.

The polycrystalline silicon part 50 functions as a structural component that restricts the spreading into the termination region 200 of holes that are injected into the drift layer 21 of the cell region 100 in the state in which the built-in diode is biased in the forward direction. By restricting the spreading of the holes into the termination region 200, the return current from the termination region 200 can be reduced; the ejection path of the holes to the upper electrode 60 can be short; and the reverse recovery time can be short. From the perspective of restricting the spreading of the holes into the termination region 200, it is desirable for the depth of the polycrystalline silicon part 50 to be greater than the depth of the buried structure part 30. In other words, it is desirable for the distance (the shortest distance) between the polycrystalline silicon part 50 and the lower electrode 70 to be less than the distance (the shortest distance) between the buried structure part 30 and the lower electrode 70. The polycrystalline silicon part 50 does not reach the silicon substrate 10.

A heavy metal such as Pt, Au, etc., does not easily pass through a silicon oxide film. Therefore, if a silicon oxide film is provided between the polycrystalline silicon part 50 and the drift layer 21, there is a risk that the heavy metal that diffuses into the termination region 200 may be undesirably returned to the cell region 100 by the silicon oxide film acting as a barrier.

When the depletion layer that extends into the termination region 200 reaches the polycrystalline silicon part 50, the electric field distribution changes at that portion of the polycrystalline silicon part 50; and when the electric field distribution exceeds a critical electric field intensity, there is a risk that local avalanche breakdown may occur. Therefore, it is desirable to form the polycrystalline silicon part 50 at a position that is not reached by the depletion layer.

Second Embodiment

Figure 3:
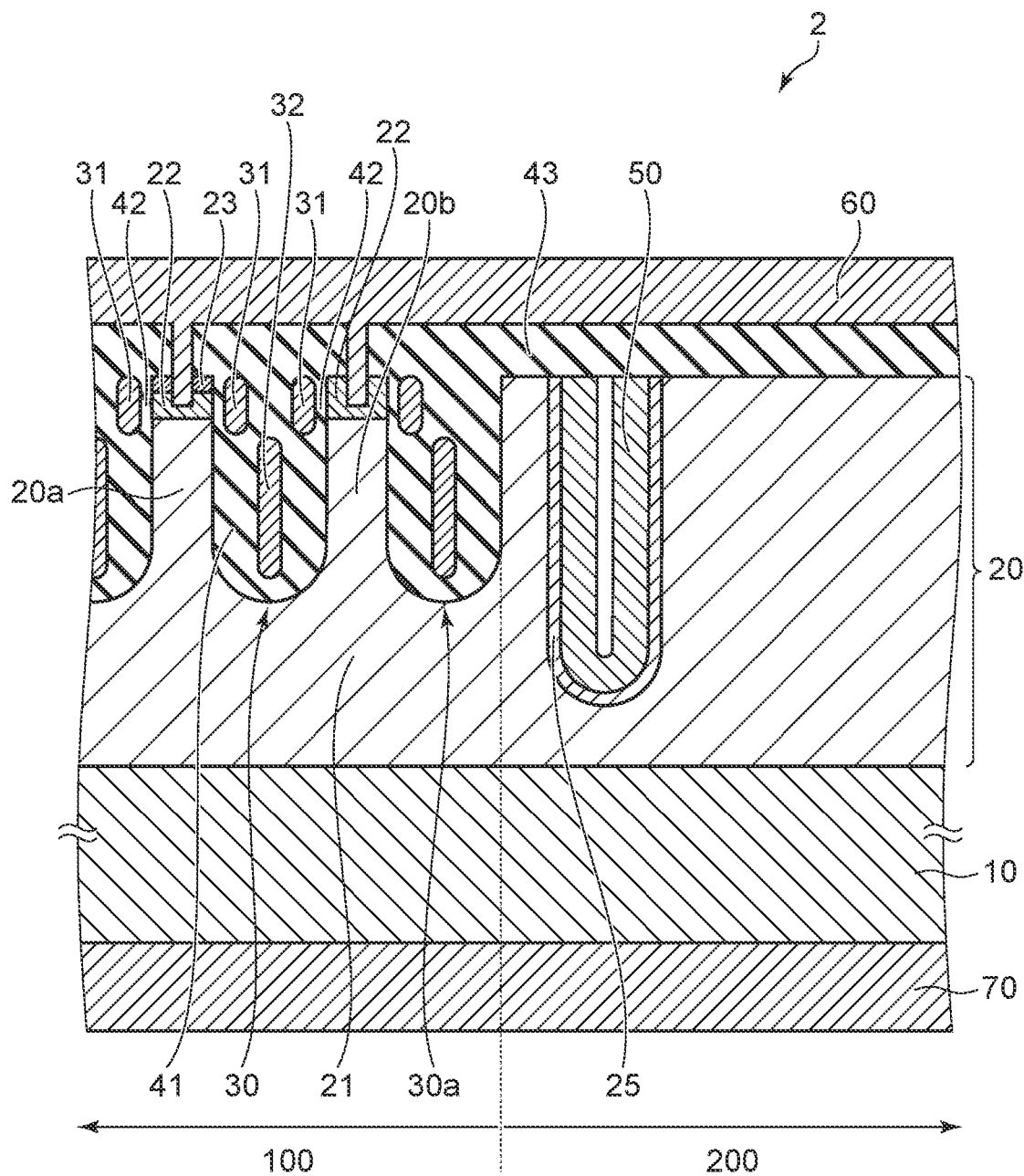
FIG. 3 is a schematic cross-sectional view of a semiconductor device of a second embodiment.

FIG. 3 is a schematic cross-sectional view of a semiconductor device 2 of a second embodiment.

The silicon layer 20 of the semiconductor device 2 further includes an n-type channel stopper 25 that is located between the polycrystalline silicon part 50 and the drift layer 21 of the termination region 200 and has a higher n-type impurity concentration than the drift layer 21. After forming a trench in the termination region 200, the channel stopper 25 is formed on the sidewall and bottom surface of the trench. Subsequently, the polycrystalline silicon part 50 is formed in the trench. The channel stopper 25 is located between the drift layer 21 and the side surface of the polycrystalline silicon part 50 and between the drift layer 21 and the bottom surface of the polycrystalline silicon part 50.

The channel stopper 25 can prevent the depletion layer from reaching the polycrystalline silicon part 50, and can prevent local avalanche breakdown.

Third Embodiment

Figure 4:
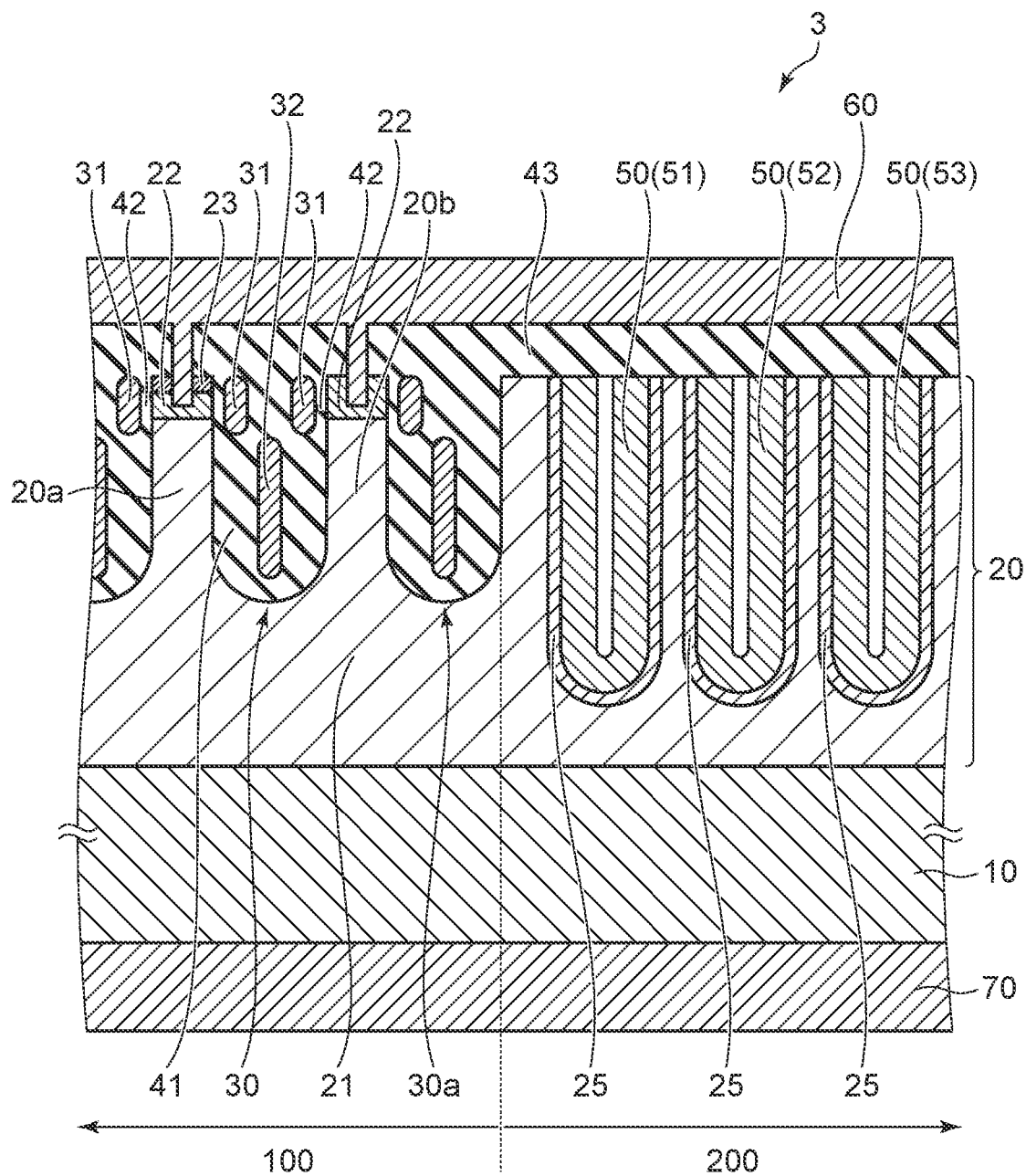
FIG. 4 is a schematic cross-sectional view of a semiconductor device of a third embodiment.

FIG. 4 is a schematic cross-sectional view of a semiconductor device 3 of a third embodiment.

For example, when the n-type impurity concentration in the drift layer 21 is high as in a device that has a relatively low breakdown voltage, the lifetime control of many carriers is necessary, and it is desirable for much of the heavy metal to be commensurately retained in the termination region 200.

As shown in FIG. 4, by providing multiple polycrystalline silicon parts 50 that include, for example, a first polycrystalline silicon part 51, a second polycrystalline silicon part 52, and a third polycrystalline silicon part 53 in the termination region 200, the gettering amount of the heavy metal in the termination region 200 can be increased according to the increase of the necessary lifetime control of the carriers. For example, in the example shown in FIG. 4, the first polycrystalline silicon part 51 is located most proximate to the cell region 100; the second polycrystalline silicon part 52 is located between the first polycrystalline silicon part 51 and the side surface 300 of the silicon layer 20 (shown in FIG. 1); and the third polycrystalline silicon part 53 is located between the second polycrystalline silicon part 52 and the side surface 300. The three polycrystalline silicon parts 51 to 53 triply surround the cell region 100. The number of the polycrystalline silicon parts 50 may be two, four, or more.

Fourth Embodiment

Figure 5:
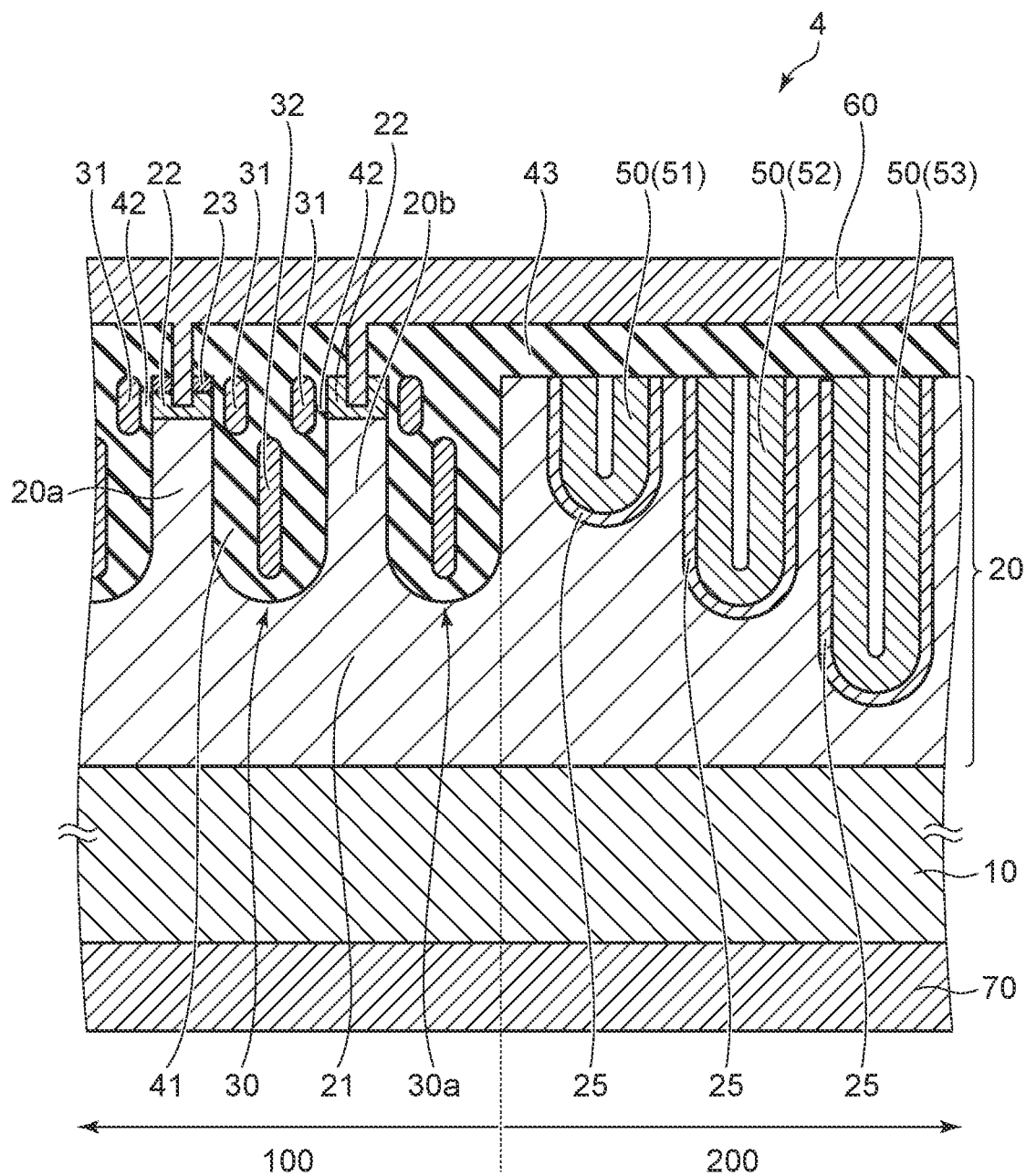
FIG. 5 is a schematic cross-sectional view of a semiconductor device of a fourth embodiment.

FIG. 5 is a schematic cross-sectional view of a semiconductor device 4 of a fourth embodiment.

As shown in FIG. 5, the first polycrystalline silicon part 51 that is shallower than the buried structure part 30 may be provided. In the example shown in FIG. 5, the first polycrystalline silicon part 51, the second polycrystalline silicon part 52, and the third polycrystalline silicon part 53 that have mutually-different depths triply surround the cell region 100. The first polycrystalline silicon part 51, the second polycrystalline silicon part 52, and the third polycrystalline silicon part 53 are arranged in the direction connecting the cell region 100 and the side surface 300. The distance (the shortest distance) between the lower electrode 70 and the first polycrystalline silicon part 51 most proximate to the cell region 100 is longer than the distance (the shortest distance) between the buried structure part 30 and the lower electrode 70. The distance (the shortest distance) between the second polycrystalline silicon part 52 and the lower electrode 70 is shorter than the distance (the shortest distance) between the first polycrystalline silicon part 51 and the lower electrode 70. The distance (the shortest distance) between the third polycrystalline silicon part 53 and the lower electrode 70 is shorter than the distance (the shortest distance) between the second polycrystalline silicon part 52 and the lower electrode 70. In the example as well, the number of the polycrystalline silicon parts 50 may be two, four, or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    an upper electrode;
    a lower electrode;
    a silicon substrate positioned between the upper electrode and the lower electrode, the silicon substrate being of a first conductivity type and contacting the lower electrode;
    a silicon layer positioned between the silicon substrate and the upper electrode, the silicon layer including
        a cell region,
        a side surface, and
        a termination region positioned between the cell region and the side surface;
    a gate electrode located in the cell region of the silicon layer;
    a gate insulating film located between the gate electrode and the silicon layer; and
    a polycrystalline silicon part buried in the termination region of the silicon layer,
    the polycrystalline silicon part contacting the silicon layer, having a higher crystal grain density than the silicon layer, and including a heavy metal,
    the silicon layer including
        a drift layer located in the cell region and the termination region, the drift layer being of the first conductivity type and having a lower first-conductivity-type impurity concentration than the silicon substrate, the drift layer including a same element of heavy metal as the heavy metal included in the polycrystalline silicon part,
        a base layer located on the drift layer of the cell region, the base layer being of a second conductivity type and contacting the upper electrode, and
        a source layer located on the base layer, the source layer being of the first conductivity type, contacting the upper electrode, and having a higher first-conductivity-type impurity concentration than the drift layer,
    the termination region not including the base layer contacting the upper electrode, the source layer contacting the upper electrode, and the gate electrode.

2. The device according to claim 1, wherein
    the polycrystalline silicon part continuously surrounds the cell region.

3. The device according to claim 1, wherein
    the gate electrode and the gate insulating film are located in a structure part buried in the silicon layer of the cell region, and
    a distance between the polycrystalline silicon part and the lower electrode is shorter than a distance between the structure part and the lower electrode.

4. The device according to claim 3, wherein
    the structure part further includes a field plate electrode electrically connected with the upper electrode or the gate electrode, and
    the field plate electrode is between the gate electrode and the silicon substrate.

5. The device according to claim 1, wherein
    the silicon layer further includes a channel stopper located between the drift layer and the polycrystalline silicon part,
    the channel stopper is of the first conductivity type, and
    the channel stopper has a higher first-conductivity-type impurity concentration than the drift layer.

6. The device according to claim 1, wherein
    a heavy metal concentration in the drift layer of the cell region is higher than a heavy metal concentration in the drift layer of a region between the polycrystalline silicon part and the side surface.

7. The device according to claim 1, wherein
    a heavy metal concentration in the drift layer of a region between the cell region and the polycrystalline silicon part is higher than a heavy metal concentration in the drift layer of a region between the polycrystalline silicon part and the side surface.

8. The device according to claim 1, wherein
    the heavy metal is Pt.

9. The device according to claim 1, wherein
    the heavy metal is Au.

10. The device according to claim 1, wherein
    the polycrystalline silicon part includes:
        a first polycrystalline silicon part; and
        a second polycrystalline silicon part positioned between the first polycrystalline silicon part and the side surface.

11. The device according to claim 10, wherein
    the gate electrode and the gate insulating film are located in a structure part buried in the silicon layer of the cell region, and
    a distance between the first polycrystalline silicon part and the lower electrode is longer than a distance between the structure part and the lower electrode.

12. The device according to claim 10, wherein
    a distance between the second polycrystalline silicon part and the lower electrode is shorter than a distance between the first polycrystalline silicon part and the lower electrode.

13. The device according to claim 10, wherein
    the first polycrystalline silicon part and the second polycrystalline silicon part continuously surround the cell region.

14. The device according to claim 1, wherein
    the drift layer does not contact the upper electrode at an upper surface of the termination region.

15. The device according to claim 1, wherein the polycrystalline silicon part is electrically insulated from the upper electrode.

* * * * *